United States Patent
Rofougaran et al.

(10) Patent No.: US 9,442,190 B2
(45) Date of Patent: Sep. 13, 2016

(54) METHOD AND SYSTEM FOR A RFID TRANSPONDER WITH CONFIGURABLE FEED POINT FOR RFID COMMUNICATIONS

(71) Applicant: Broadcom Corporation, Irvine, CA (US)

(72) Inventors: Ahmadreza Rofougaran, Newport Coast, CA (US); Maryam Rofougaran, Rpv, CA (US)

(73) Assignee: BROADCOM CORPORATION, Irvine, CA (US)

( * ) Notice: Subject to any disclaimer, the term of this patent is extended or adjusted under 35 U.S.C. 154(b) by 0 days.

(21) Appl. No.: 14/661,322

(22) Filed: Mar. 18, 2015

(65) Prior Publication Data

US 2015/0193642 A1     Jul. 9, 2015

Related U.S. Application Data

(63) Continuation of application No. 12/797,041, filed on Jun. 9, 2010, now Pat. No. 9,013,311.

(60) Provisional application No. 61/246,618, filed on Sep. 29, 2009, provisional application No. 61/185,245, filed on Jun. 9, 2009.

(51) Int. Cl.
*H01Q 13/22* (2006.01)
*H01Q 15/23* (2006.01)
(Continued)

(52) U.S. Cl.
CPC ........... *G01S 13/06* (2013.01); *G06K 7/10316* (2013.01); *H01Q 1/2283* (2013.01); *H01Q 13/20* (2013.01); *H01Q 13/22* (2013.01); *H01Q 15/0066* (2013.01); *H01Q 15/23* (2013.01);
(Continued)

(58) Field of Classification Search
CPC ...... H01Q 13/20; H01Q 13/22; H01Q 13/28; H01Q 13/206; H01Q 1/2283; H01Q 21/005
See application file for complete search history.

(56) References Cited

U.S. PATENT DOCUMENTS 4,701,763 A   10/1987  Yamamoto
5,138,436 A    8/1992  Koepf
(Continued)

OTHER PUBLICATIONS

J. Yeo and D. Kim, "Novel Design of a High-gain and Wideband Fabry-Perot Cavity Antenna Using a Tapered AMC Substrate," J. Infrared Milli. Terahz. Waves, vol. 30, No. 3, pp. 217-224, Mar. 2009.*

(Continued)

*Primary Examiner* — Sue A Purvis
*Assistant Examiner* — Amal Patel
(74) *Attorney, Agent, or Firm* — Oblon, McClelland, Maier & Neustadt, L.L.P.

(57) ABSTRACT

A Method and system for a RFID transponder with configurable feed point for RFID communications is provided. In this regard, an RFID transponder may receive RF signals via a leaky wave antenna and modulate an amplitude of a backscattered signal associated with the received RF signals by switching between a plurality of feed points of the leaky wave antenna to vary an input impedance of said RFID transponder. Each of the plurality of feed points may be located in a different position in the resonant cavity of the leaky wave antenna. The input impedance may be controlled by switching a load in and out of a receive path of the RFID transponder. The leaky wave antenna may be integrated within and/or on an integrated circuit, an integrated circuit package, or a combination thereof.

11 Claims, 17 Drawing Sheets

(51) Int. Cl.
  *H01Q 19/06* (2006.01)
  *G01S 13/06* (2006.01)
  *H01Q 1/22* (2006.01)
  *H01Q 13/20* (2006.01)
  *H04B 1/04* (2006.01)
  *H04B 5/00* (2006.01)
  *H04B 7/24* (2006.01)
  *G06K 7/10* (2006.01)
  *H01Q 15/00* (2006.01)

(52) U.S. Cl.
  CPC ............... *H01Q 19/06* (2013.01); *H04B 1/04* (2013.01); *H04B 1/0458* (2013.01); *H04B 5/0031* (2013.01); *H04B 7/24* (2013.01); *H01Q 15/006* (2013.01); *Y10T 307/25* (2015.04)

(56) References Cited

U.S. PATENT DOCUMENTS

| | | |
|---|---|---|
| 5,300,875 A | 4/1994 | Tuttle |
| 5,363,075 A | 11/1994 | Fanucchi |
| 5,387,885 A | 2/1995 | Chi |
| 5,717,943 A | 2/1998 | Barker |
| 5,900,843 A | 5/1999 | Lee |
| 5,912,598 A | 6/1999 | Stones |
| 5,943,025 A | 8/1999 | Benham |
| 6,005,520 A | 12/1999 | Nalbandian |
| 6,037,743 A | 3/2000 | White |
| 6,127,799 A | 10/2000 | Krishnan |
| 6,212,431 B1 | 4/2001 | Hahn |
| 6,285,325 B1 | 9/2001 | Nalbandian |
| 6,597,323 B2 | 7/2003 | Teshirogi |
| 6,603,915 B2 | 8/2003 | Glebov |
| 6,726,099 B2 | 4/2004 | Becker |
| 6,735,630 B1 | 5/2004 | Gelvin |
| 6,771,935 B1 | 8/2004 | Leggett |
| 6,841,981 B2 | 1/2005 | Smith |
| 6,954,236 B1 | 10/2005 | Russell |
| 7,002,517 B2 | 2/2006 | Noujeim |
| 7,020,701 B1 | 3/2006 | Gelvin |
| 7,023,374 B2 | 4/2006 | Jossef |
| 7,084,823 B2 | 8/2006 | Caimi |
| 7,242,368 B2 * | 7/2007 | Thevenot ............ H01Q 5/00 343/700 MS |
| 7,253,780 B2 | 8/2007 | Sievenpiper |
| 7,268,517 B2 | 9/2007 | Rahmel |
| 7,317,342 B2 | 1/2008 | Saint-Laurent |
| 7,330,090 B2 | 2/2008 | Itoh |
| 7,348,928 B2 | 3/2008 | Ma |
| 7,373,133 B2 | 5/2008 | Mickle |
| 7,394,288 B1 | 7/2008 | Agarwal |
| 7,535,958 B2 | 5/2009 | Best |
| 7,592,957 B2 | 9/2009 | Achour |
| 7,620,424 B2 | 11/2009 | Cetiner |
| 7,733,265 B2 | 6/2010 | Margomenos |
| 7,855,696 B2 | 12/2010 | Gummalla |
| 8,195,103 B2 | 6/2012 | Waheed |
| 8,242,957 B2 | 8/2012 | Rofougaran |
| 8,285,231 B2 | 10/2012 | Rofougaran |
| 8,295,788 B2 | 10/2012 | Rofougaran |
| 8,299,971 B2 | 10/2012 | Talty |
| 2002/0000936 A1 | 1/2002 | Sheen |
| 2002/0005807 A1 | 1/2002 | Sheen |
| 2002/0041256 A1 | 4/2002 | Saitou |
| 2002/0135568 A1 | 9/2002 | Chen |
| 2003/0122729 A1 | 7/2003 | Diaz |
| 2004/0066251 A1 | 4/2004 | Eleftheriades |
| 2004/0145452 A1 | 7/2004 | Fischer |
| 2004/0203944 A1 | 10/2004 | Huomo |
| 2004/0227667 A1 | 11/2004 | Sievenpiper |
| 2004/0227668 A1 | 11/2004 | Sievenpiper |
| 2004/0263378 A1 | 12/2004 | Jossef |
| 2004/0263408 A1 | 12/2004 | Sievenpiper |
| 2005/0012667 A1 | 1/2005 | Noujeim |
| 2005/0052424 A1 | 3/2005 | Shih |
| 2005/0116864 A1 | 6/2005 | Mohamadi |
| 2005/0134579 A1 | 6/2005 | Hsieh |
| 2005/0136972 A1 | 6/2005 | Smith |
| 2006/0066326 A1 | 3/2006 | Slupsky |
| 2006/0109127 A1 | 5/2006 | Barink |
| 2006/0125703 A1 | 6/2006 | Ma |
| 2006/0281423 A1 | 12/2006 | Caimi |
| 2007/0171076 A1 | 7/2007 | Stevens |
| 2007/0190952 A1 | 8/2007 | Waheed |
| 2007/0273607 A1 | 11/2007 | Chen |
| 2007/0285248 A1 | 12/2007 | Hamel |
| 2007/0287403 A1 | 12/2007 | Sjoland |
| 2008/0068174 A1 | 3/2008 | Al-Mahdawi |
| 2008/0105966 A1 | 5/2008 | Beer |
| 2008/0159243 A1 | 7/2008 | Rofougaran |
| 2008/0231603 A1 | 9/2008 | Parkinson |
| 2008/0258981 A1 | 10/2008 | Achour |
| 2008/0278400 A1 | 11/2008 | Lohninger |
| 2008/0284085 A1 | 11/2008 | Curina |
| 2008/0316135 A1 | 12/2008 | Hilgers |
| 2009/0108996 A1 | 4/2009 | Day |
| 2009/0153250 A1 | 6/2009 | Rofougaran |
| 2009/0153421 A1 | 6/2009 | Rofougaran |
| 2009/0153427 A1 | 6/2009 | Rofougaran |
| 2009/0153428 A1 | 6/2009 | Rofougaran |
| 2009/0156157 A1 | 6/2009 | Rofougaran |
| 2009/0160612 A1 | 6/2009 | Varpula |
| 2009/0243740 A1 | 10/2009 | Rofougaran |
| 2009/0243741 A1 | 10/2009 | Rofougaran |
| 2009/0243742 A1 | 10/2009 | Rofougaran |
| 2009/0243767 A1 | 10/2009 | Rofougaran |
| 2009/0243779 A1 | 10/2009 | Rofougaran |
| 2009/0247109 A1 | 10/2009 | Rofougaran |
| 2009/0251362 A1 | 10/2009 | Margomenos |
| 2009/0278596 A1 | 11/2009 | Rofougaran |
| 2009/0279593 A1 | 11/2009 | Rofougaran |
| 2009/0280768 A1 | 11/2009 | Rofougaran |
| 2010/0110943 A2 | 5/2010 | Gummalla |
| 2010/0222105 A1 | 9/2010 | Nghiem |
| 2010/0308668 A1 | 12/2010 | Rofougaran |
| 2010/0308767 A1 | 12/2010 | Rofougaran |
| 2010/0308885 A1 | 12/2010 | Rofougaran |
| 2010/0308970 A1 | 12/2010 | Rofougaran |
| 2010/0308997 A1 | 12/2010 | Rofougaran |
| 2010/0309040 A1 | 12/2010 | Rofougaran |
| 2010/0309056 A1 | 12/2010 | Rofougaran |
| 2010/0309069 A1 | 12/2010 | Rofougaran |
| 2010/0309071 A1 | 12/2010 | Rofougaran |
| 2010/0309072 A1 | 12/2010 | Rofougaran |
| 2010/0309073 A1 | 12/2010 | Rofougaran |
| 2010/0309074 A1 | 12/2010 | Rofougaran |
| 2010/0309075 A1 | 12/2010 | Rofougaran |
| 2010/0309076 A1 | 12/2010 | Rofougaran |
| 2010/0309077 A1 | 12/2010 | Rofougaran |
| 2010/0309078 A1 | 12/2010 | Rofougaran |
| 2010/0309079 A1 | 12/2010 | Rofougaran |
| 2010/0309824 A1 | 12/2010 | Rofougaran |
| 2010/0311324 A1 | 12/2010 | Rofougaran |
| 2010/0311332 A1 | 12/2010 | Rofougaran |
| 2010/0311333 A1 | 12/2010 | Rofougaran |
| 2010/0311338 A1 | 12/2010 | Rofougaran |
| 2010/0311340 A1 | 12/2010 | Rofougaran |
| 2010/0311355 A1 | 12/2010 | Rofougaran |
| 2010/0311356 A1 | 12/2010 | Sjofougaran |
| 2010/0311359 A1 | 12/2010 | Rofougaran |
| 2010/0311363 A1 | 12/2010 | Rofougaran |
| 2010/0311364 A1 | 12/2010 | Rofougaran |
| 2010/0311367 A1 | 12/2010 | Rofougaran |
| 2010/0311368 A1 | 12/2010 | Rofougaran |
| 2010/0311369 A1 | 12/2010 | Rofougaran |
| 2010/0311376 A1 | 12/2010 | Rofougaran |
| 2010/0311379 A1 | 12/2010 | Rofougaran |
| 2010/0311380 A1 | 12/2010 | Rofougaran |
| 2010/0311472 A1 | 12/2010 | Rofougaran |
| 2010/0311493 A1 | 12/2010 | Miller |
| 2011/0163930 A1* | 7/2011 | De Lustrac ........ H01Q 15/148 343/777 |

(56) References Cited

U.S. PATENT DOCUMENTS

| | | |
|---|---|---|
| 2012/0095531 A1 | 4/2012 | Derbas |
| 2012/0153731 A9 | 6/2012 | Kirby |
| 2012/0263256 A1 | 10/2012 | Waheed |

OTHER PUBLICATIONS

Sterner, M.; Chicherin, D.; Raisenen, A.V.; Stemme, G.; Oberhammer, J., "RF MEMS High-Impedance Tuneable Metamaterials for Millimeter-Wave Beam Steering," in Micro Electro Mechanical Systems, 2009. MEMS 2009. IEEE 22nd International Conference on , vol., no., pp. 896-899, Jan. 25-29, 2009.*
Iyer et al., "Wireless chip to chip interconnections for multichip modules using leaky wave antennas", Nov. 1993, pp. 2030-2031.
Huang et al., "An Electronically Switchable Leaky Wave Antenna", Nov. 2000, pp. 1769-1772.
Grbic et al., "Leaky CPW-Based Slot Antenna Arrays for Millimeter-Wave Applications", Nov. 2002, pp. 1494-1504.
Floyd et al., "Wireless Interconnects for Clock Distribution", pp. 105-108.
Zvolensky et al., "Leaky-Wave antenna based on micro-electromechanical systems-loaded microstrip line", 2011, pp. 357-363.
O, K.K. et al., "Silicon Integrated Circuits Incorporating Antennas", IEEE Custom Integrated Circuits Conference, 2006, pp. 473-480.
Sterner et al., "RF MEMS High-Impedance Tuneable Metamaterials for Millimeter-Wave Beam Steering", Micro Electro Mechanical Systems, 2009, pp. 896-899.
Ourir et al., "Electronically Reconfigurable Metamaterial for Compact Directive Cavity Antennas", Electronics Letters, 2007.
Kimoto et al., "On-Chip Wireless Signal Transmission using Silicon Integrated Antennas", Measurement 40, No. 30, (2004): 20.
Feresidis et al., "Flat Plate Millimetre Wave Antenna Based on Partially Reflective FSS", $11^{th}$ International Conference on Antennas and Propagation, 2001, pp. 33-36.

* cited by examiner

METHOD AND SYSTEM FOR A RFID TRANSPONDER WITH CONFIGURABLE FEED POINT FOR RFID COMMUNICATIONS

CROSS-REFERENCE TO RELATED APPLICATIONS/INCORPORATION BY REFERENCE

This application is a continuation of U.S. application Ser. No. 12/797,041 filed Jun. 9, 2010, which makes reference to, claims the benefit from, and claims priority to U.S. Provisional Application Ser. No. 61/246,618 filed on Sep. 29, 2009, and U.S. Provisional Application Ser. No. 61/185,245 filed on Jun. 9, 2009.

This application also makes reference to:
U.S. patent application Ser. No. 12/650,212 filed on Dec. 30, 2009;
U.S. patent application Ser. No. 12/650,295 filed on Dec. 30, 2009;
U.S. patent application Ser. No. 12/650,277 filed on Dec. 30, 2009;
U.S. patent application Ser. No. 12/650,192 filed on Dec. 30, 2009;
U.S. patent application Ser. No. 12/650,224 filed on Dec. 30, 2009;
U.S. patent application Ser. No. 12/650,176 filed on Dec. 30, 2009;
U.S. patent application Ser. No. 12/650,246 filed on Dec. 30, 2009;
U.S. patent application Ser. No. 12/650,292 filed on Dec. 30, 2009;
U.S. patent application Ser. No. 12/650,324 filed on Dec. 30, 2009;
U.S. patent application Ser. No. 12/708,366 filed on Feb. 18, 2010;
U.S. patent application Ser. No. 12/751,550 filed on Mar. 31, 2010;
U.S. patent application Ser. No. 12/751,768 filed on Mar. 31, 2010;
U.S. patent application Ser. No. 12/751,759 filed on Mar. 31, 2010;
U.S. patent application Ser. No. 12/751,593 filed on Mar. 31, 2010;
U.S. patent application Ser. No. 12/751,772 filed on Mar. 31, 2010;
U.S. patent application Ser. No. 12/751,777 filed on Mar. 31, 2010;
U.S. patent application Ser. No. 12/751,782 filed on Mar. 31, 2010;
U.S. patent application Ser. No. 12/751,792 filed on Mar. 31, 2010;
U.S. patent application Ser. No. 12/751,751 filed on Mar. 31, 2010;
U.S. patent application Ser. No. 12/790,279 filed on May 28, 2010;
U.S. patent application Ser. No. 12/797,029 filed on Jun. 9, 2010;
U.S. patent application Ser. No. 12/797,068 filed on Jun. 9, 2010;
U.S. patent application Ser. No. 12/797,133 filed on Jun. 9, 2010;
U.S. patent application Ser. No. 12/797,162 filed on Jun. 9, 2010;
U.S. patent application Ser. No. 12/797,177 filed on Jun. 9, 2010;
U.S. patent application Ser. No. 12/797,203 filed on Jun. 9, 2010;
U.S. patent application Ser. No. 12/796,822 filed on Jun. 9, 2010;
U.S. patent application Ser. No. 12/797,214 filed on Jun. 9, 2010;
U.S. patent application Ser. No. 12/796,841 filed on Jun. 9, 2010;
U.S. patent application Ser. No. 12/797,232 filed on Jun. 9, 2010;
U.S. patent application Ser. No. 12/796,862 filed on Jun. 9, 2010;
U.S. patent application Ser. No. 12/796,975 filed on Jun. 9, 2010;
U.S. patent application Ser. No. 12/797,112 filed on Jun. 9, 2010;
U.S. patent application Ser. No. 12/797,254 filed on Jun. 9, 2010;
U.S. patent application Ser. No. 12/797,273 filed on Jun. 9, 2010; and
U.S. patent application Ser. No. 12/797,316 filed on Jun. 9, 2010.

Each of the above stated applications is hereby incorporated herein by reference in its entirety.

FIELD OF THE INVENTION

Certain embodiments of the invention relate to wireless communication. More specifically, certain embodiments of the invention relate to a method and system for a RFID transponder with configurable feed point for RFID communications.

BACKGROUND OF THE INVENTION

Radio frequency identification (RFID) is a data collection technology that enables the storing and remote retrieval of data utilizing devices referred to as RFID tags, or transponders. An RFID transponder may comprise a silicon integrated circuit, or chip, and an antenna that enables the RFID transponder to receive and respond to radio frequency (RF) queries from an RFID transceiver, or reader. The RFID transponder may comprise memory, for example a random access memory (RAM) or an electrically erasable programmable read only memory (EEPROM), which enables storage of data. The data may comprise an electronic product code (EPC) that may be utilized to locate an item to which the RFID transponder is attached. For example, libraries may attach RFID transponders to books to enable the tracking of books that are checked out to library patrons. RFID transponders may be integrated into "smart cards" and/or into other electronic devices such as mobile phones. The RFID transponders may enable storage of account information that enables the holder of the smart card to purchase goods and services. The transponder may, for example, store a current balance that indicates a monetary value of goods and services that may be purchased with the transponder. The transponder holder may purchase goods and services by holding the transponder in the proximity of an RFID reader that retrieves account information from the smart card.

Designers of RFID transponders are challenged with the tasks of increasing the range at which the transponder can communicate with the reader and improving the energy efficiency due to the limited power available to the transponder, all while keeping the transponder extremely small and inexpensive.

Further limitations and disadvantages of conventional and traditional approaches will become apparent to one of skill in the art, through comparison of such systems with the present invention as set forth in the remainder of the present application with reference to the drawings.

BRIEF SUMMARY OF THE INVENTION

A system and/or method for a RFID transponder with configurable feed point for RFID communications as shown in and/or described in connection with at least one of the figures, as set forth more completely in the claims.

Various advantages, aspects and novel features of the present invention, as well as details of an illustrated embodiment thereof, will be more fully understood from the following description and drawings.

DETAILED DESCRIPTION OF THE INVENTION

Certain aspects of the invention may be found in a method and system for a RFID transponder with integrated leaky wave antenna. In various embodiments of the invention, an RFID transponder may receive RF signals via a leaky wave antenna and modulate an amplitude of a backscattered signal associated with the received RF signals by switching between a plurality of feed points of the leaky wave antenna to vary an input impedance of said RFID transponder. Each of the plurality of feed points may be located in a different position in the resonant cavity of the leaky wave antenna. The input impedance may be varied by switching a load in and out of a receive path of the RFID transponder. The switching between the plurality of feed points and/or the switching of the load in and out of a receive path may be performed utilizing a micro-electromechanical system switch and/or one or more switches. The leaky wave antenna may be integrated within and/or on an integrated circuit, an integrated circuit package, or a combination thereof. The received RF signal may cause a charge to accumulate on one or more capacitors in the RFID transponder resulting in a voltage that may be utilized to control and/or power one or more portions of the RFID transponder. The voltage may be utilized to control a switch that connects and disconnects a battery of the RFID transponder to one or more other components of the RFID transponder. The voltage may be utilized to power a radio subsystem 128 and/or a processing subsystem 130 of the RFID transponder.

Figure 1A:
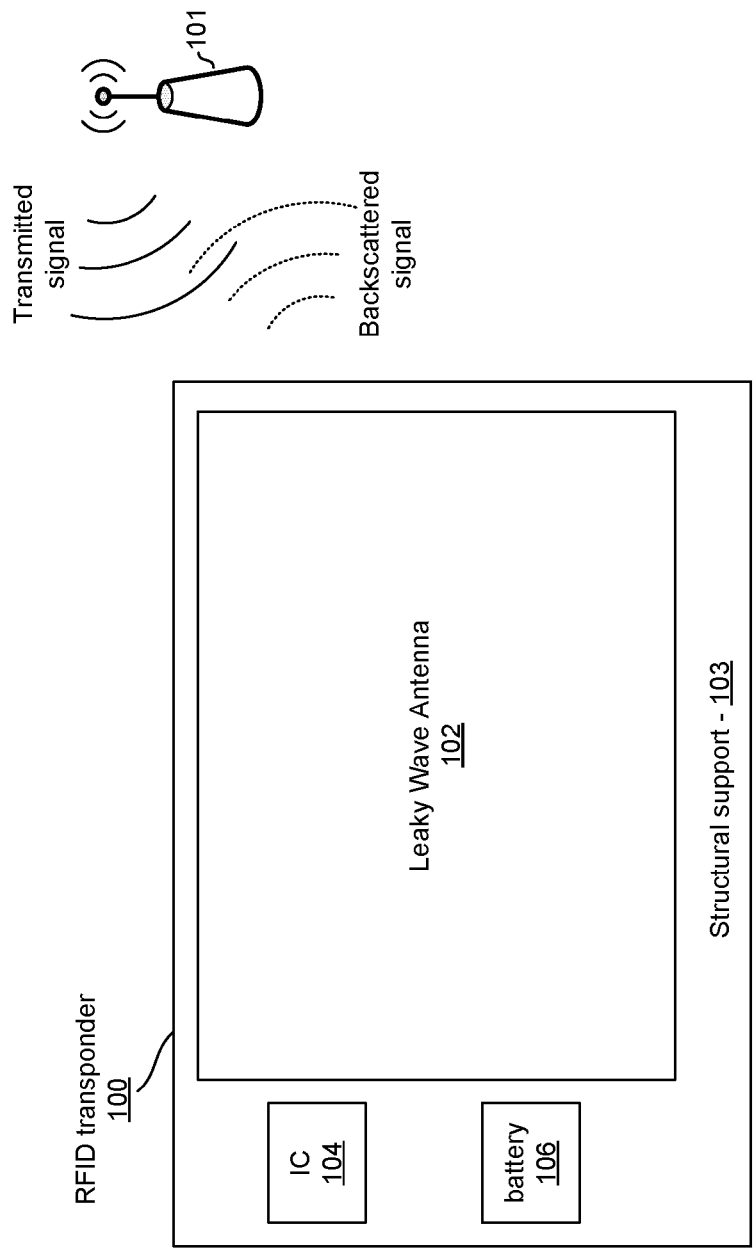
FIG. 1A is a plane view of an exemplary RFID transponder comprising a leaky wave antenna, in accordance with an embodiment of the invention.

FIG. 1A is a block diagram of an RFID transponder with leaky wave antenna, in accordance with an embodiment of the invention. Referring to FIG. 1, there is shown an RFID reader 101 and an RFID transponder 100. The RFID transponder 100 may comprise a structural support 103, an integrated circuit (IC) 104, a battery 106, and a leaky wave antenna 102.

The structural support 103 may comprise, for example plastic and/or some dielectric material on and/or within which the IC 104, the battery 106, and the leaky wave antenna 102 may be fabricated. In an exemplary embodiment of the invention, the structural support 103 may have physical dimensions approximately equal to those of a credit card.

The IC, or "chip," 104 may comprise suitable logic, circuitry, interfaces, and/or code that may be operable to communicate with the RFID reader 101. In this regard, the IC 104 may be operable to receive and process signals from an RFID reader 101 via the leaky wave antenna 102 and to communicate signals to the RFID reader 101 via a backscatter communication channel. In various embodiments of the invention, the IC 104 may be operable to control an input impedance of the transponder 101 to modulate the amplitude of the backscattered signal. In various embodiments of the invention, the IC 104 may be operable to control, via a micro-electromechanical system (MEMS), the height, and thus the resonant frequency, of a cavity of the leaky wave antenna 102. Altering the height of the cavity may be utilized to modulate the frequency of the backscattered signal. An exemplary IC 104 in described in further detail with respect to FIG. 1C.

The leaky wave antenna 102 may comprise a resonant cavity with a highly reflective surface and a lower reflectivity surface. The lower reflectivity surface may allow the resonant mode to "leak" out of the cavity. The lower reflectivity surface of the leaky wave antenna 102 may comprise a slotted metal surface or a pattern of metal patches, as described further in FIGS. 2 and 3. The bandwidth and/or radiation pattern of the leaky wave antenna 102 may be determined, at least in part, by the physical dimensions of the leaky wave antenna 102. In an exemplary embodiment of the invention, the leaky wave antenna 102 may be operable to transmit and/or receive wireless signals at or near 60 GHz, for example, due to the cavity height being on the order of millimeters. In an exemplary embodiment of the invention, the cavity height of the leaky wave antenna 102 may be configured, e.g., via MEMS, to control the frequency of the signals that may be transmitted and/or received.

In operation, the RFID transponder 100 may receive RF signals from the RF reader 101, decode the received RF signals, and respond to the received RF signals via a backscatter communication link. In this regard, to communicate to the RFID reader 101, the transponder may modulate its input impedance and/or modulate the resonant frequency of the leaky wave antenna 102 such that information is impressed on the reflected or backscattered waves. The input impedance may be modulated by, for example, switching between a configuration in which the terminals 120A and 120B of the antenna 102 are open-circuited and a configuration in which there is a load between the terminals 120A and 120B of the antenna 102. The input impedance may be modulated by, for example, switching between a plurality of feed points of the leaky wave antenna 102. The resonant frequency of the antenna 102 may be modulated by switching between a configuration in which the surfaces of the antenna 102 are closer together and a configuration in which the surfaces of the antenna 102 are farther apart.

Figure 1B:
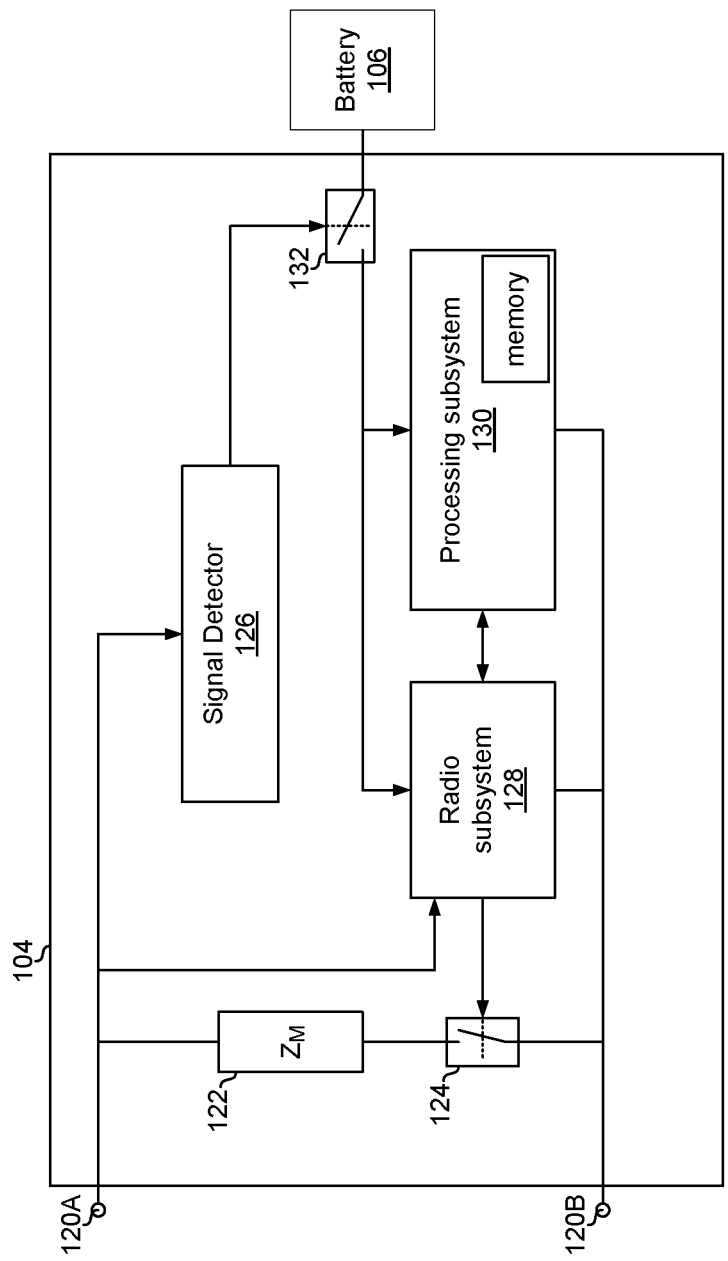
FIG. 1B illustrates an exemplary active RFID transponder comprising a leaky wave antenna, in accordance with an embodiment of the invention.

FIG. 1B illustrates an exemplary active RFID transponder comprising a leaky wave antenna, in accordance with an embodiment of the invention. Referring to FIG. 1B, the IC 104 comprises antenna terminals 120A and 120B, a load 122, switch 124, signal detector 126, radio subsystem 128, processing subsystem 130, and switch 134.

The terminals 120A may enable coupling the IC 104 to the leaky wave antenna 100. In an exemplary embodiment of the invention, the terminal 102A may couple to a positive terminal of a feed point of the antenna 100 and the terminal 120B may couple to a negative terminal of the feed point of the antenna 100.

The load 122 may comprise, for example, one or more resistors, capacitors, inductors, and/or a combination thereof. The switches 124 and 134 may comprise, for example, MOSFET switches, or MEMS switches.

The signal detector 126 may comprise suitable logic, circuitry, interfaces, and/or code that may be operable to detect RF energy from the RFID reader 101 and, if the signal from the RFID reader 101 is of sufficient strength, generate a control signal to close the switch 132. When the switch is closed, the battery 106 may be connected to the radio subsystem 128 and the processing subsystem 130, thus powering on the transponder 100. In an exemplary embodiment of the invention, the signal detector may comprise a filter to set a frequency response of the signal detector 126 and one or more diodes and/or capacitors and may accumulate a charge on a capacitor in the presence of an RF signal from the reader 101.

The radio subsystem 128 may comprise suitable logic, circuitry, interfaces, and/or code that may be operable to receive RF signals and detect information impressed on the received RF signals. In this regard, the radio subsystem 128 may demodulate an RF signal received via the antenna 102 and output the corresponding baseband signal to the processing subsystem 130. Additionally, the radio subsystem 128 may comprise suitable logic, circuitry, interfaces, and/or code to modulate the backscattered signal by controlling the switch 124. The invention is not limited to any particular encoding. As an example, a logic '1' received from the processing subsystem 103 may be communicated by opening and closing switch 124 X times over a time interval and a logic '0' may be communicated by opening and closing the switch Y times over the same time interval. In this regard, the amplitude of the backscattered signal may change X times over the time interval when a '1' is transmitted and may change Y times when a '0' is transmitted.

The processing subsystem 130 may comprise suitable logic, circuitry, interface(s), and/or code that may be enabled to process baseband signals received from the radio subsystem 128 and generate baseband signals which may be utilized by the radio subsystem 128 to modulate the backscattered signal. For example, processing subsystem 130 may comprise one or more state machines that may generate signals to control the transponder 100. Control and/or data information utilized for processing received data and/or for generating data to be transmitted may be stored in memory in the processing subsystem 130. For example, an alphanumeric identifier of the RFID transponder 100 may be stored in the processing subsystem 130 and may be transmitted via the radio subsystem In operation, an RF signal may be received from the RF reader 101 and charge may accumulate on a capacitor in the signal detector 126 until a sufficient voltage is achieved to close the switch 132. Upon the switch being closed 132, the radio subsystem 128 and the processing subsystem may power up. The radio subsystem 122 may initially leave the switch 124 in either the open or closed position, whichever results in more efficient reception of the RF signal, and may begin receiving the RF Signal from the RFID reader. The received RF signal may be demodulated by the radio subsystem 128 and the resulting baseband signal may be conveyed to the processing subsystem 130. The processing subsystem 130 may process the received signal and may generate a response signal. For example, upon receiving a particular bit sequence, the processing subsystem 130 may respond by communicating a response bit sequence stored in memory. The response bit sequence may be output from the processing subsystem 130 to the radio 128 and the radio may encode the response bit sequence and control the switch 124 accordingly to amplitude modulate the response bit sequence onto the backscattered signal.

Figure 1C:
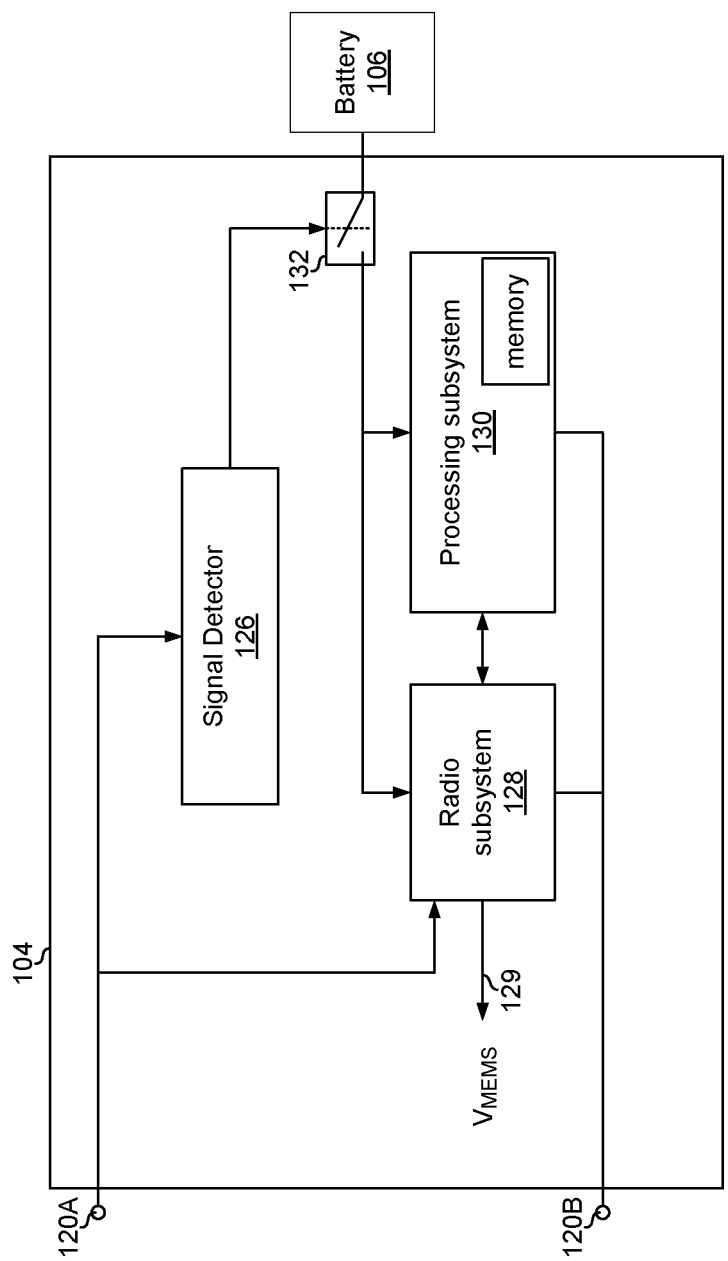
FIG. 1C illustrates an exemplary active RFID transponder comprising a leaky wave antenna, in accordance with an embodiment of the invention.

FIG. 1C illustrates an exemplary active RFID transponder comprising a leaky wave antenna, in accordance with an embodiment of the invention. Referring to FIG. 1C, the RFID transponder 100 may be substantially the same as described with respect to FIG. 1B. However, rather than switching between a loaded antenna and open-circuited antenna, the radio subsystem 128 in FIG. 1C may control a MEMS that may determine the height of the resonant cavity of the leaky wave antenna 102. For example, when the signal 129 is a logic '1' the height of the cavity of the leaky wave antenna 102 may be h1 and when signal 129 is a logic '0' the height of the cavity of the leaky wave antenna 102 may be h2. In this regard, since altering the height of the cavity changes the resonant frequency of the backscattered signal, switching between the two heights may frequency modulate the response bit sequence onto the backscattered signal.

Figure 1D:
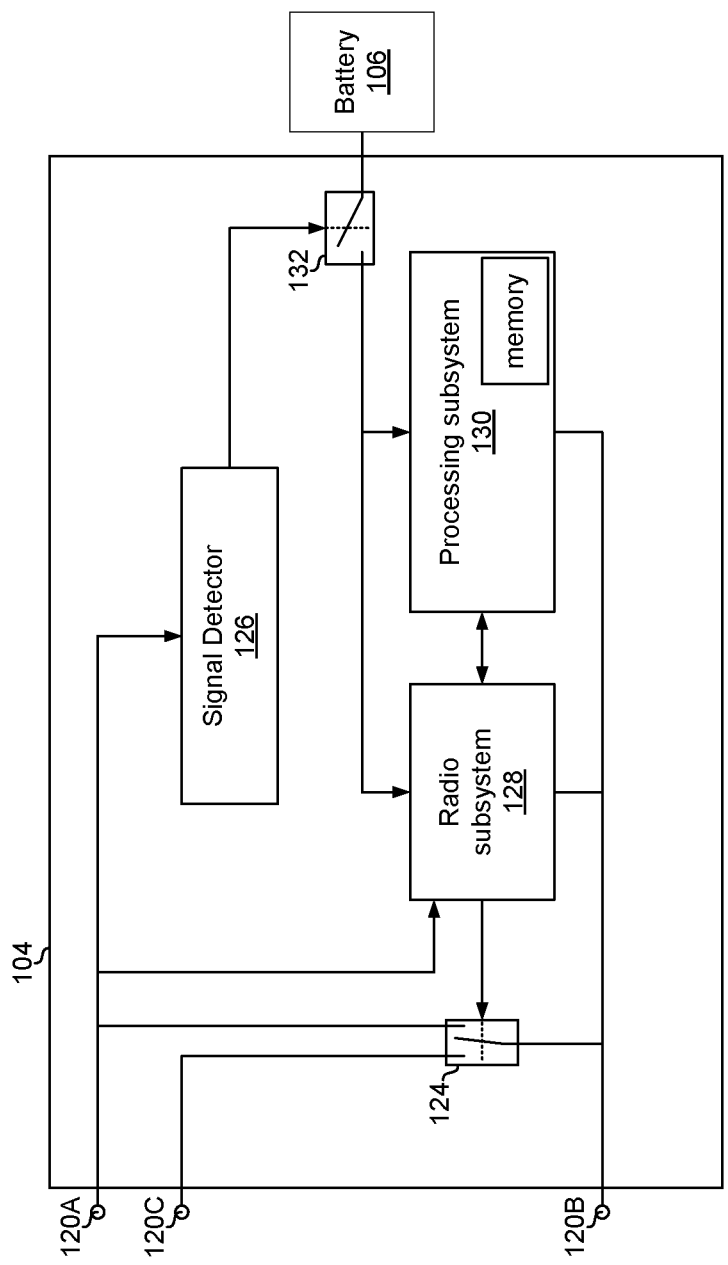
FIG. 1D illustrates an exemplary active RFID transponder comprising a leaky wave antenna, in accordance with an embodiment of the invention.

FIG. 1D illustrates an exemplary active RFID transponder comprising a leaky wave antenna, in accordance with an embodiment of the invention. Referring to FIG. 1D, the RFID transponder 100 may be substantially the same as described with respect to FIG. 1B, however, the IC 104 in FIG. 1D may comprise three antenna terminals 120A, 120B, and 120C. The terminal 120A my couple to a positive terminal of a first feed point of the antenna 102, the terminal 120C may couple to a positive terminal of a second feed point of the antenna 102, and the terminal 120B may couple to negative terminals of each of the feed points of the antenna 102. The various feed points may present different impedances as described below with respect to FIG. 6.

In operation, rather than switching between an open-circuit and the load 122 as in FIG. 1B, the radio subsystem 128 in FIG. 1D may switch between the antenna terminal 120A and 120C. For example, when the signal 129 is a logic '1' the terminal 120A may be selected and when signal 129 is a logic '0' the terminal 120C may be selected. In this regard, because altering the input impedance of the antenna alters the amplitude of the backscattered signal, switching between the terminals 120A and 120C may amplitude modulate the response bit sequence onto the backscattered signal.

Figure 1E:
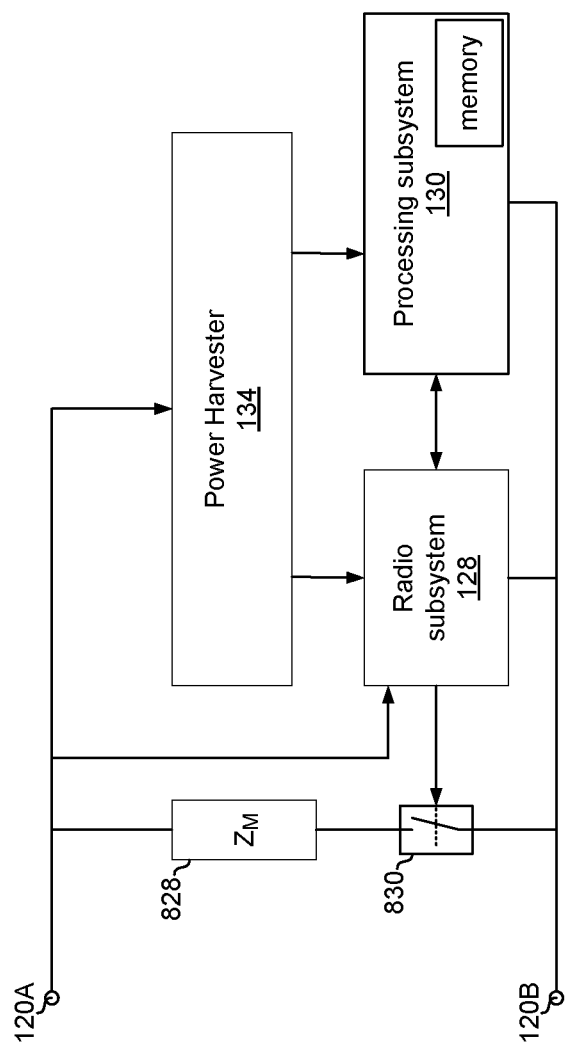
FIG. 1E illustrates an exemplary passive RFID transponder comprising a leaky wave antenna, in accordance with an embodiment of the invention.

FIG. 1E illustrates an exemplary passive RFID transponder comprising a leaky wave antenna, in accordance with an embodiment of the invention. The passive transponder 100 shown in FIG. 1E may be similar to the active transponder 100 depicted in FIG. 1B, however, the passive transponder 100 of FIG. 1E comprises a power harvester 132 rather than the signal detector 126 and the battery 106. The power harvester 132 may behave similarly to the power detector 126 in that a received RF signal may cause charge to accumulate on one or more capacitors resulting in a voltage developing across the one or more capacitors. The voltage generated by the power harvester 132 may then be utilized to power the radio subsystem 128 and the processing subsystem 130. Thus, unlike the active transponder in FIGS. 1B-1D, the active transponders in FIGS. 1E-1G may not require a battery. An exemplary power harvester is described below with respect to FIG. 1H.

Figure 1F:
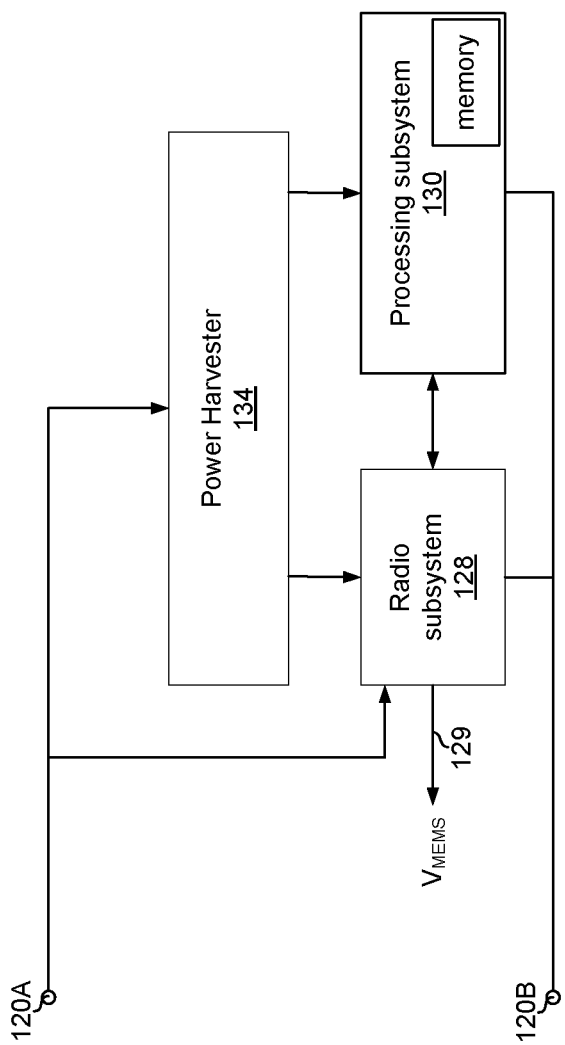
FIG. 1F illustrates an exemplary passive RFID transponder comprising a leaky wave antenna, in accordance with an embodiment of the invention.

FIG. 1F illustrates an exemplary passive RFID transponder comprising leaky wave antenna, in accordance with an embodiment of the invention. The RFID transponder in FIG. 1F may be similar to the passive RFID transponder 100 described with respect to FIG. 1C, but may comprise a power harvester 132 rather than the battery 106, the signal detector 126, and the switch 132.

Figure 1G:
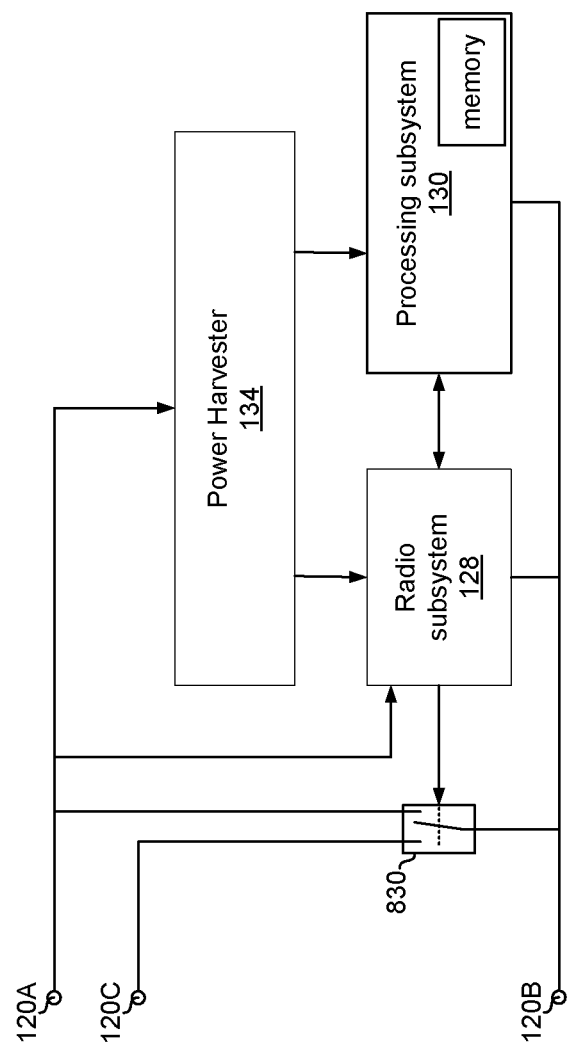
FIG. 1G illustrates an exemplary passive RFID transponder comprising a leaky wave antenna, in accordance with an embodiment of the invention.

FIG. 1G illustrates an exemplary passive RFID transponder comprising leaky wave antenna, in accordance with an embodiment of the invention. The RFID transponder in FIG. 1G may be similar to the passive RFID transponder 100 described with respect to FIG. 1D, but may comprise a power harvester 132 rather than the battery 106, the signal detector 126, and the switch 132.

Figure 1H:
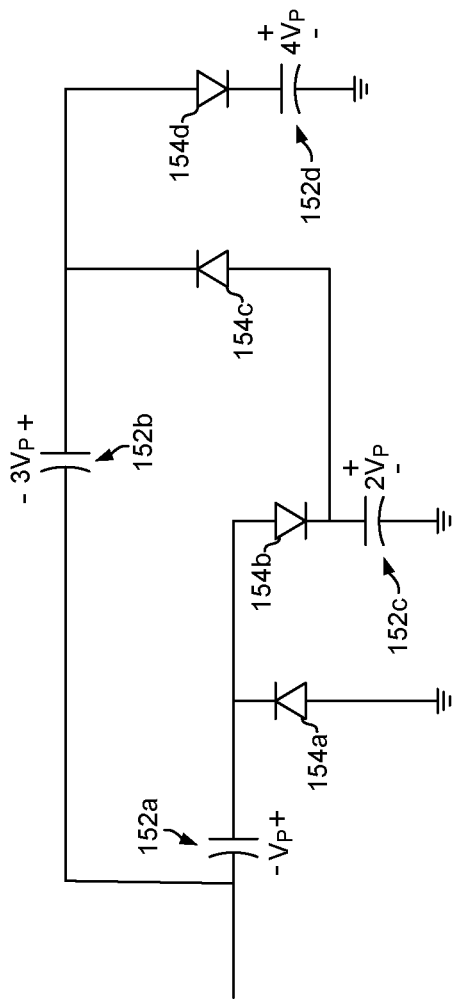
FIG. 1H illustrates an exemplary power harvester, in accordance with an embodiment of the invention.

FIG. 1H illustrates an exemplary power harvester, in accordance with an embodiment of the invention. Referring to FIG. 1H there is shown capacitors 152a-152d and diodes 154a-154d. In operation a RF signal having a peak voltage of Vp may be incident on the terminal 156 and may result in a voltage of 4*Vp across the capacitor 152d.

Figure 2A:
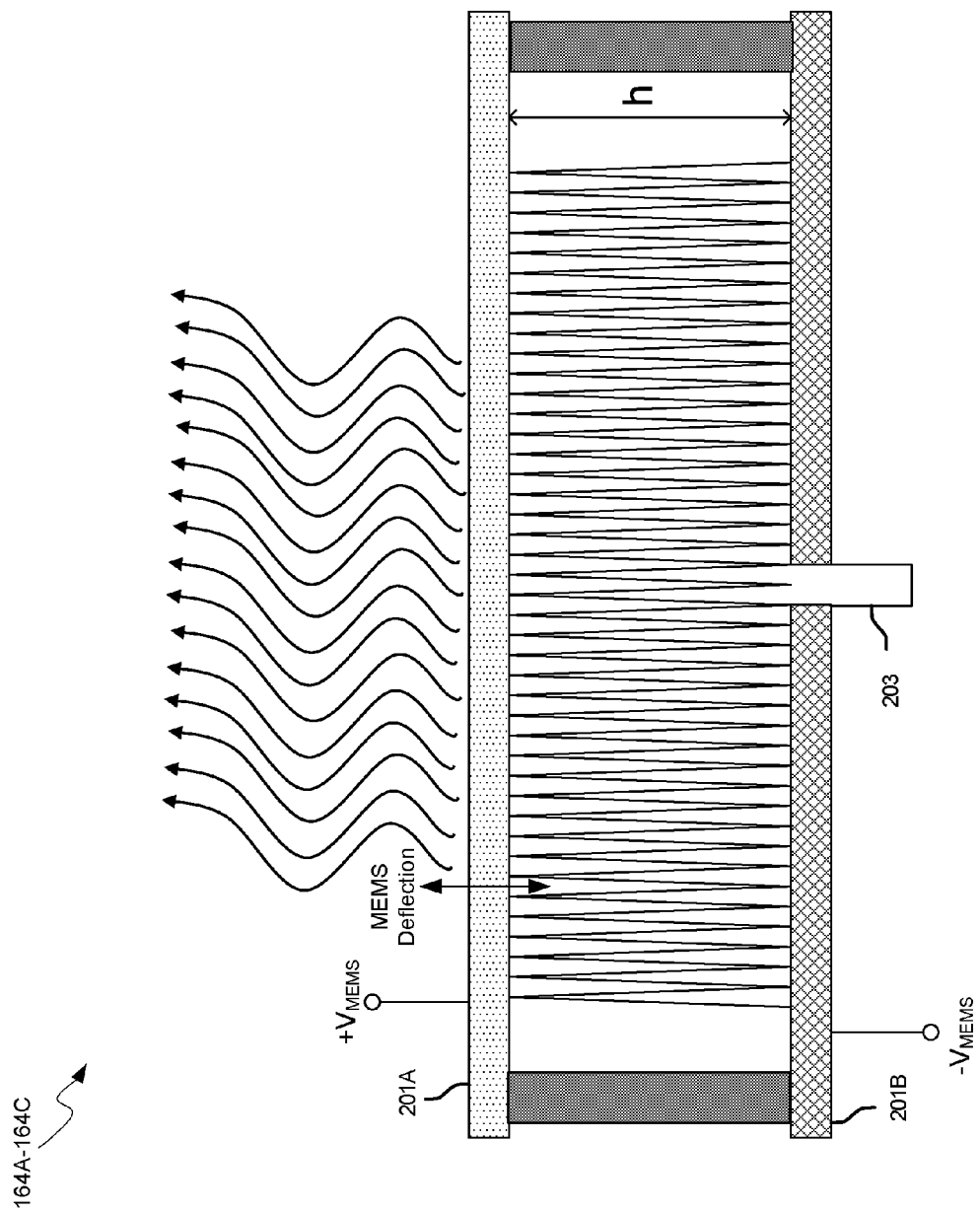
FIG. 2A is a cross-sectional view of an exemplary leaky wave antenna, in accordance with an embodiment of the invention.

FIG. 2A is a cross-sectional view of an exemplary leaky wave antenna, in accordance with an embodiment of the invention. Referring to FIG. 2A, there is shown the leaky wave antenna 102 comprising a partially reflective surface 201A, a reflective surface 201B, and a feed point 203. The space between the partially reflective surface 201A and the reflective surface 201B may be filled with dielectric material, for example, and the height, h, between the partially reflective surface 201A and the reflective surface 201B may be utilized to configure the frequency of optimal transmission and reception of the leaky wave antenna 102. In another embodiment of the invention, an air gap may be integrated in the space between the partially reflective surface 201A and the reflective surface 201B to enable MEMS actuation. There is also shown MEMS bias voltage, $+V_{MEMS}$ and $-V_{MEMS}$.

The feed point 203 may comprise a terminal for applying an input voltage to the leaky wave antenna 102 and/or coupling received signals from the antenna 102 to other circuitry of the transponder 100. The invention is not limited to a single feed point 203, as there may be any number of feed points for different phases of signal or a plurality of signal sources, for example.

In an embodiment of the invention, the height, h, may be one-half the wavelength of the desired transmitted mode from the leaky wave antenna 102. In this manner, the phase of an electromagnetic mode that traverses the cavity twice may be coherent with the input signal at the feed point 203, thereby configuring a resonant cavity known as a Fabry-Perot cavity. The magnitude of the resonant mode may decay exponentially in the lateral direction from the feed point 203, thereby reducing or eliminating the need for confinement structures to the sides of the leaky wave antenna 102. The input impedance of the leaky wave antenna 102 may be configured by the vertical placement of the feed point 203, as described further in FIG. 6.

In operation, a received signal may pass through the surface 201A and be reflected back and forth between the surface 201A and 201B. Since the cavity height is half of the wavelength of the signal to be received, waves incident on the feed point will have travelled an integer multiple of a full wavelength, and thus constructive interference may result and a resonant mode may thereby be established. The resonant mode may enable the leaky wave antenna 102 to provide relatively high gain without the need for a large array of antennas or a complex feed network.

Figure 2B:
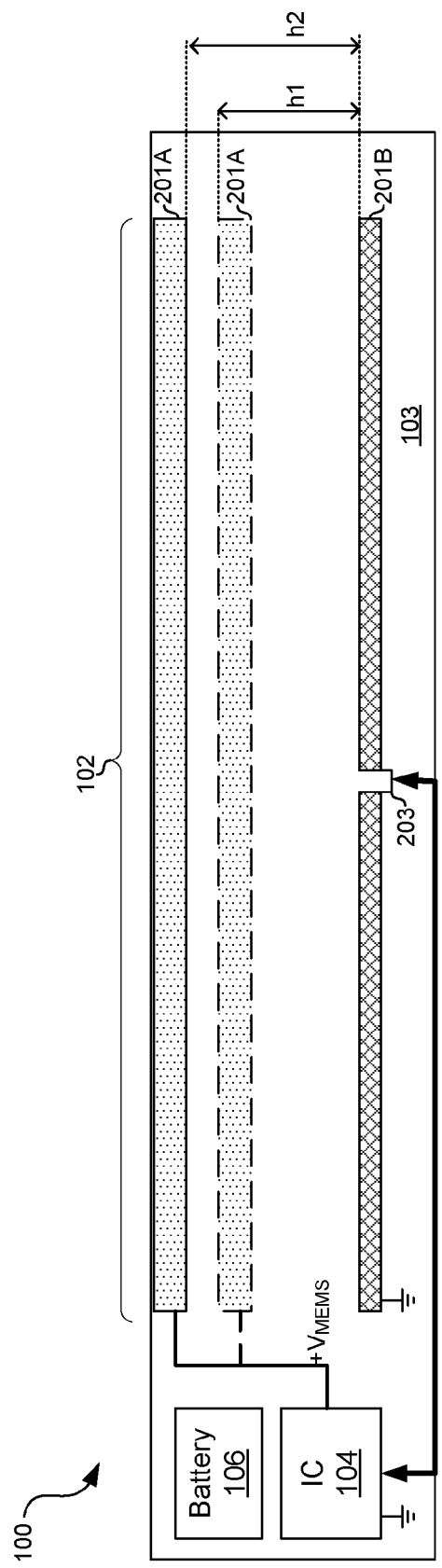
FIG. 2B is a cross-sectional view of an exemplary RFID transponder comprising a leaky wave antenna, in accordance with an embodiment of the invention.

As described further with respect to FIG. 2B, the cavity height of the leaky wave antenna 102 may be configured by MEMS actuation. For example, the bias voltages $+V_{MEMS}$ and $-V_{MEMS}$ may deflect one or both of the reflective surfaces 201A and 201B compared to zero bias, thereby configuring the height of the cavity and thus the resonant frequency of the cavity.

FIG. 2B is a cross-sectional view of an exemplary RFID transponder comprising a leaky wave antenna, in accordance with an embodiment of the invention. Referring to FIG. 2B, there is shown the lower reflectivity surface 108 and the higher reflectivity surface 110 of the leaky wave antenna 102. Two positions of the surface 108 are shown. When the surface 102 is in the lower position, the height of the cavity of the antenna 102 may be h1, and when the surface 102 is in the upper position, the height of the cavity of the antenna 102 may be h2. In operation, the position of the surface 108 may be controlled via a digital signal from the IC 104. In this regard, the surface 201B may be grounded and the surface 201A may be coupled to $V_{MEMS}$, and thus $V_{MEMS}$ being a positive voltage may cause the surface 201A to be in a the upper position and $V_{MEMS}$ being equal to ground may cause the surface 201B to be in the lower position.

Figure 3:
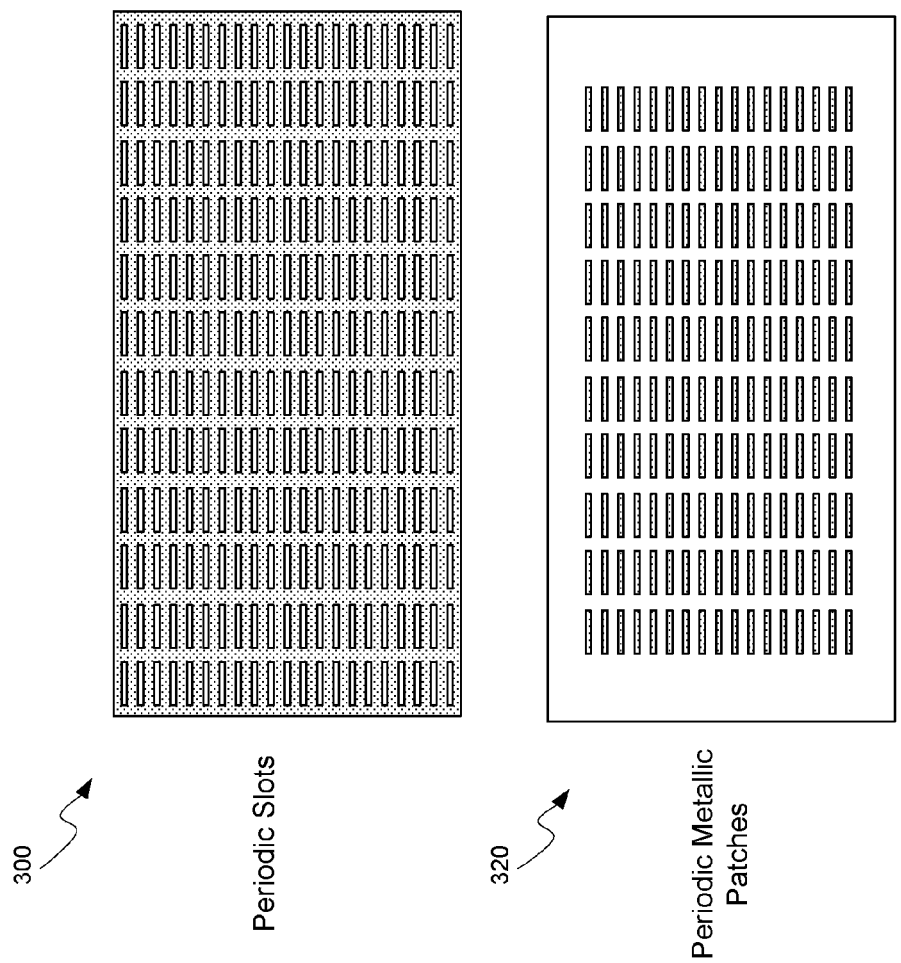
FIG. 3 is a block diagram illustrating a plan view of exemplary partially reflective surfaces for a leaky wave antenna, in accordance with an embodiment of the invention.

FIG. 3 is a block diagram illustrating a plan view of exemplary partially reflective surfaces for a leaky wave antenna, in accordance with an embodiment of the invention. Referring to FIG. 3, there is shown a partially reflective surface 300 comprising periodic slots in a metal surface, and a partially reflective surface 320 comprising periodic metal patches. The partially reflective surfaces 300/320 may comprise different embodiments of the partially reflective surface 201A described with respect to FIGS. 2A and 2B.

The spacing, dimensions, shape, and orientation of the slots and/or patches in the partially reflective surfaces 300/320 may be utilized to configure the bandwidth, and thus Q-factor, of the resonant cavity defined by the partially reflective surfaces 300/320 and a reflective surface, such as the reflective surface 201B, described with respect to FIGS. 2A and 2B. The partially reflective surfaces 300/320 may thus comprise frequency selective surfaces due to the narrow bandwidth of signals that may leak out of the structure as configured by the slots and/or patches.

The spacing between the patches and/or slots may be related to wavelength of the signal transmitted and/or received, which may be somewhat similar to beamforming with multiple antennas. The length of the slots and/or patches may be several times larger than the wavelength of the transmitted and/or received signal or less, for example, since the leakage from the slots and/or regions surround the patches may add up, similar to beamforming with multiple antennas. In an embodiment of the invention, the slots/patches may be configured via CMOS and/or micro-electromechanical system (MEMS) to tune the Q of the resonant cavity.

Figure 4:
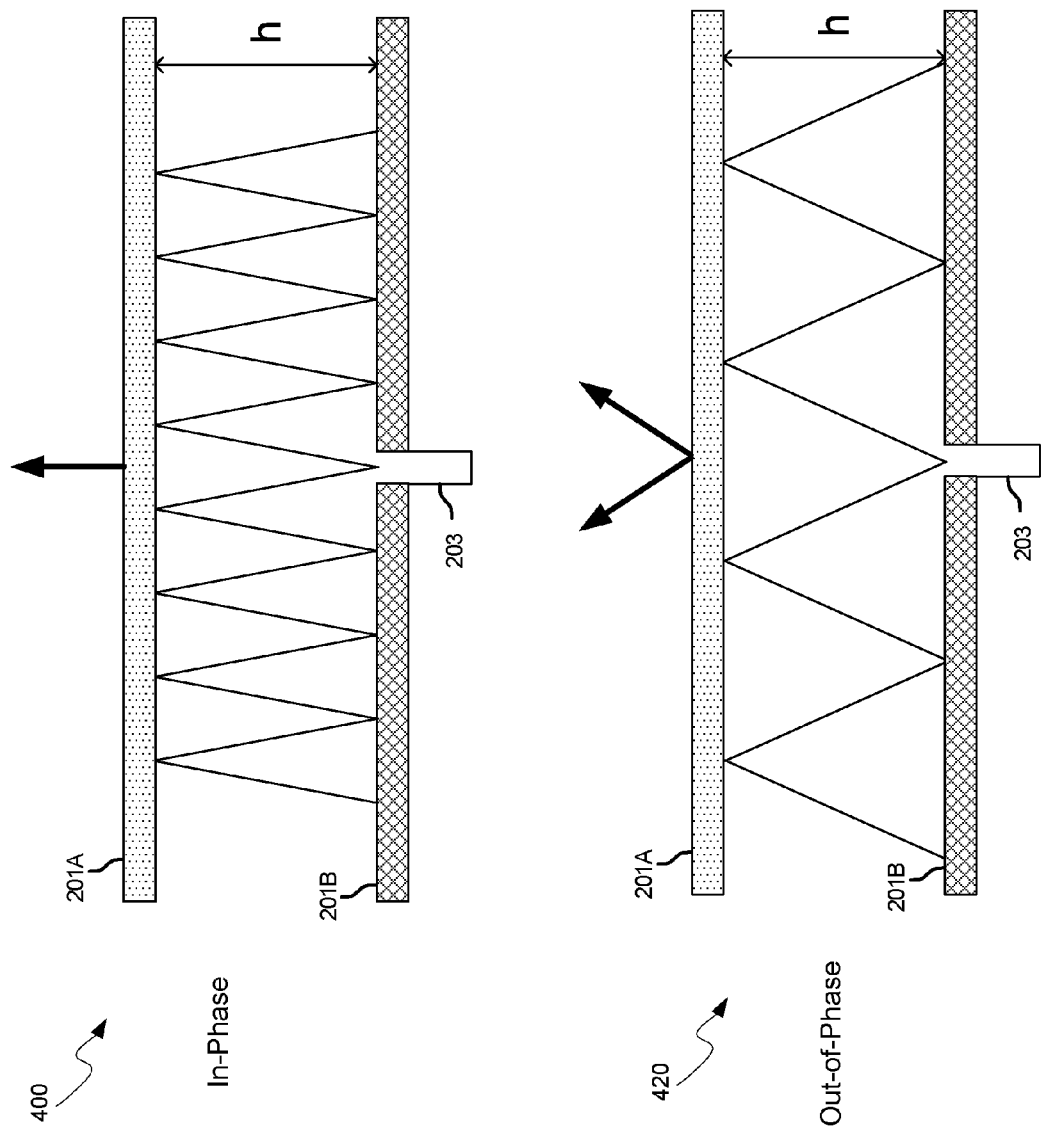
FIG. 4 is a block diagram illustrating an exemplary phase dependence of a leaky wave antenna, in accordance with an embodiment of the invention.

FIG. 4 is a block diagram illustrating an exemplary phase dependence of a leaky wave antenna, in accordance with an embodiment of the invention. Referring to FIG. 4, there is shown a leaky wave antenna comprising the partially reflective surface 201A, the reflective surface 201B, and the feed point 203. In-phase condition 400 illustrates the relative beam shape transmitted by the leaky wave antenna 102 when the frequency of the signal communicated to the feed point 203 matches that of the resonant cavity as defined by the cavity height, h, and the dielectric constant of the material between the reflective surfaces. Similarly, out-of-phase condition 420 illustrates the relative beam shape transmitted by the leaky wave antenna 102 when the frequency of the signal communicated to the feed point 203 does not match that of the resonant cavity. The resulting beam shape may be conical, as opposed to a single main vertical node. These are illustrated further with respect to FIG. 5.

By configuring the leaky wave antenna 102 for in-phase and out-of-phase conditions, signals possessing different characteristics may be directed in desired directions. In an exemplary embodiment of the invention, the angle at which signals may be transmitted or received by a leaky wave antenna may be dynamically controlled so that signal may be directed to desired receiving leaky wave antennas. In another embodiment of the invention, the leaky wave antenna 102 may be operable to receive RF signals, such as 60 GHz signals, for example. The direction in which the signals are received may be configured by the in-phase and out-of-phase conditions.

Figure 5:
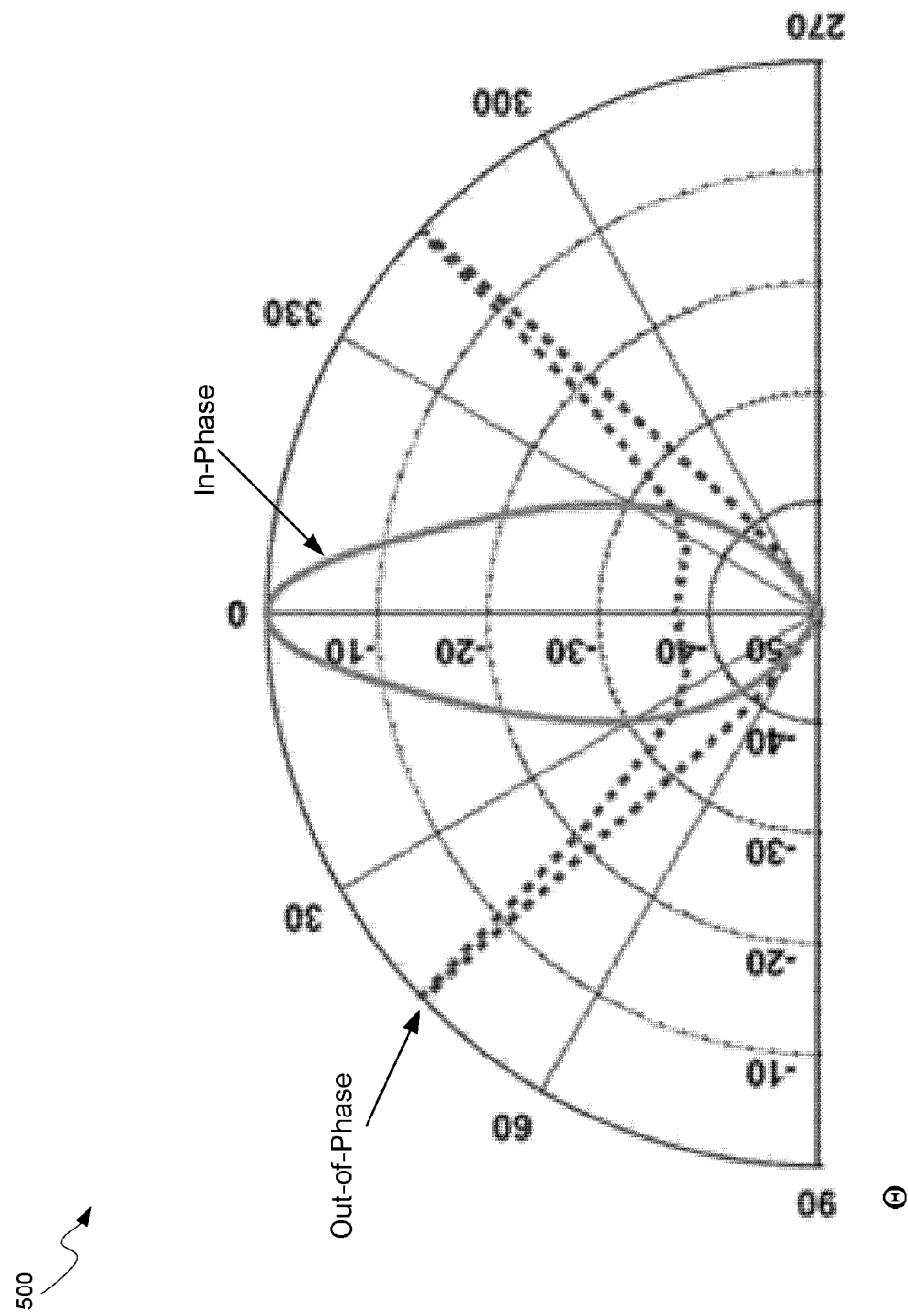
FIG. 5 is a block diagram illustrating exemplary in-phase and out-of-phase beam shapes for a leaky wave antenna, in accordance with an embodiment of the invention.

FIG. 5 is a block diagram illustrating exemplary in-phase and out-of-phase beam shapes for a leaky wave antenna, in accordance with an embodiment of the invention. Referring to FIG. 5, there is shown a plot 500 of transmitted signal beam shape versus angle, $\Theta$, for the in-phase and out-of-phase conditions for a leaky wave antenna.

The In-phase curve in the plot 500 may correlate to the case where the frequency of the signal communicated to a leaky wave antenna matches the resonant frequency of the cavity. In this manner, a single vertical main node may result. In instances where the frequency of the signal at the feed point is not at the resonant frequency, a double, or conical-shaped node may be generated as shown by the Out-of-phase curve in the plot 500. By configuring the leaky wave antennas for in-phase and out-of-phase conditions, the leaky wave antenna 102 may be configured to receive signals from a desired direction via the in-phase and out-of-phase configurations.

Figure 6:
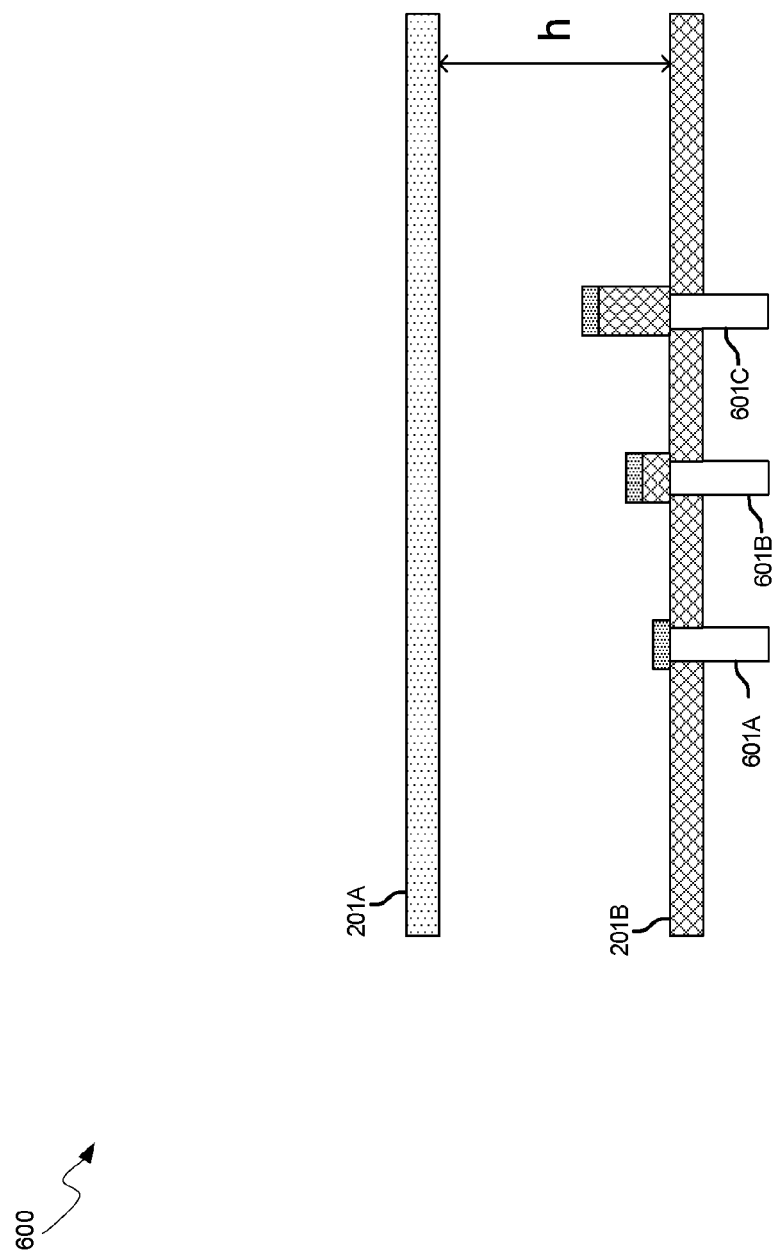
FIG. 6 is a block diagram illustrating a leaky wave antenna with variable input impedance feed points, in accordance with an embodiment of the invention.

FIG. 6 is a block diagram illustrating a leaky wave antenna with variable input impedance feed points, in accordance with an embodiment of the invention. Referring to FIG. 6, there is shown a leaky wave antenna 600 comprising the partially reflective surface 201A and the reflective surface 201B. There is also shown feed points 601A-601C. The feed points 601A-601C may be located at different positions along the height of the cavity thereby configuring different impedance points for the leaky wave antenna 600. Accordingly, in instances that the antenna 600 is coupled to the IC 104, the switch 124 may select, via one or more switches and/or micro-electromechanical systems (MEMS), between the various feed points 601A, 601B, and 601C to control an input impedance of the transponder 100. In this manner, the amplitude of the backscattered signal may be modulated by switching between two or more feed points of a leaky wave antenna.

Figure 7:
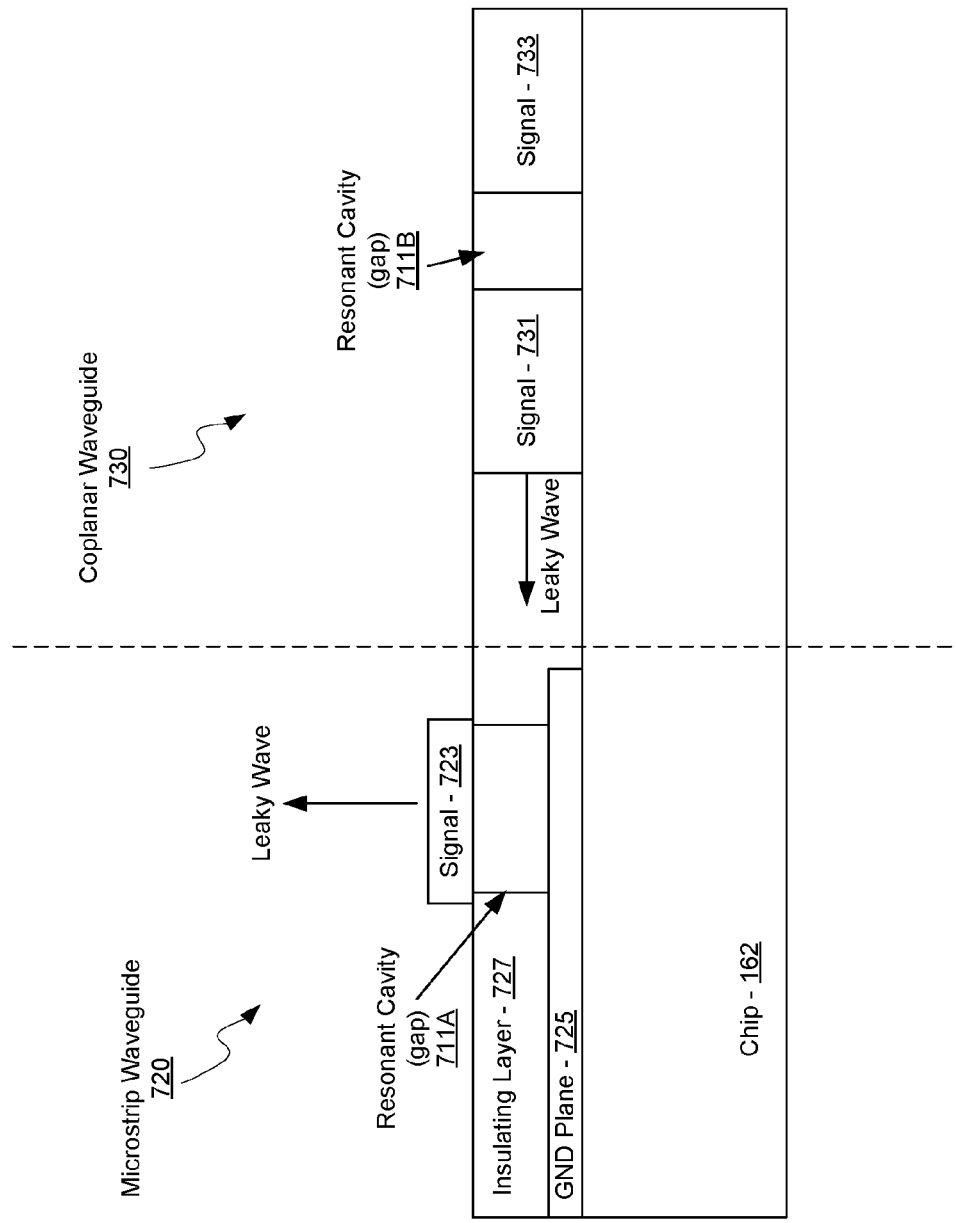
FIG. 7 is a block diagram illustrating a cross-sectional view of coplanar and microstrip waveguides, in accordance with an embodiment of the invention.

FIG. 7 is a block diagram illustrating a cross-sectional view of coplanar and microstrip waveguides, in accordance with an embodiment of the invention. Referring to FIG. 7, there is shown a microstrip waveguide 720 and a coplanar waveguide 730. The microstrip waveguide 720 may comprise signal conductive lines 723, a ground plane 725, a gap 711A, an insulating layer 727 and a support structure 729 which may be a semiconductor substrate, a ceramic IC package, plastic, and/or a dielectric material. The coplanar waveguide 730 may comprise signal conductive lines 731 and 733, a gap 711B, the insulating layer 727, and the support structure 729.

The signal conductive lines 723, 731, and 733 may comprise metal traces or layers deposited in and/or on the insulating layer 727. In another embodiment of the invention, the signal conductive lines 723, 731, and 733 may comprise poly-silicon or other conductive material. The separation and the voltage potential between the signal conductive line 723 and the ground plane 725 may determine the electric field generated therein. In addition, the dielectric constant of the insulating layer 727 may also determine the electric field between the signal conductive line 723 and the ground plane 725.

The insulating layer 727 may comprise $SiO_2$ or other insulating material that may provide a high resistance layer between the signal conductive line 723 and the ground plane 725, and the signal conductive lines 731 and 733. In addition, the electric field between the signal conductive line 723 and the ground plane 725 may be dependent on the dielectric constant of the insulating layer 727.

The thickness and the dielectric constant of the insulating layer 727 may determine the electric field strength generated by the applied signal. The resonant cavity thickness of a leaky wave antenna may be dependent on the spacing between the signal conductive line 723 and the ground plane 725, or the distance between signal conductive lines 731 and 733, for example. In an exemplary embodiment of the invention, the insulating layer 727 may be removed in localized regions in the microstrip waveguide 720 and the coplanar waveguide 730 to configure the gaps 711A and 711B, thereby allowing for MEMS deflection of the conductive layers and configuring of the height of the resonant cavity.

The signal conductive lines 731 and 733, and the signal conductive line 723 and the ground plane 725 may define resonant cavities 711A and 711B, respectively, for leaky wave antennas. Each layer may comprise a reflective surface or a partially reflective surface depending on the pattern of conductive material. For example, a partially reflective surface may be configured by alternating conductive and insulating material in a 1-dimensional or 2-dimensional pattern. In this manner, signals may be directed out of, or received into, a surface of the transponder 100, as illustrated with the microstrip waveguide 720.

The structural support 179 may provide mechanical support for the microstrip waveguide 720, the coplanar waveguide 730, and other devices that may be integrated within. In various embodiment of the invention, the structural support 179 may comprise Si, GaAs, sapphire, InP, GaO, ZnO, CdTe, CdZnTe, ceramics, polytetrafluoroethylene, and/or $Al_2O_3$, for example, or any other substrate material.

In operation, a bias and/or a signal voltage may be applied across the signal conductive line 723 and the ground plane 725, and/or the signal conductive lines 731 and 733. The thickness of a leaky wave antenna resonant cavity may be dependent on the distance between the conductive lines in the microstrip waveguide 720 and/or the coplanar transmission waveguide 730.

By alternating patches of conductive material with insulating material, or slots of conductive material in dielectric material, a partially reflective surface may result, which may allow a signal to "leak out" in that direction, as shown by the Leaky Wave arrows in FIG. 7. In this manner, wireless signals may be directed out of the surface plane of the chip 162, or parallel to the surface of the structural support 179.

Figure 8:
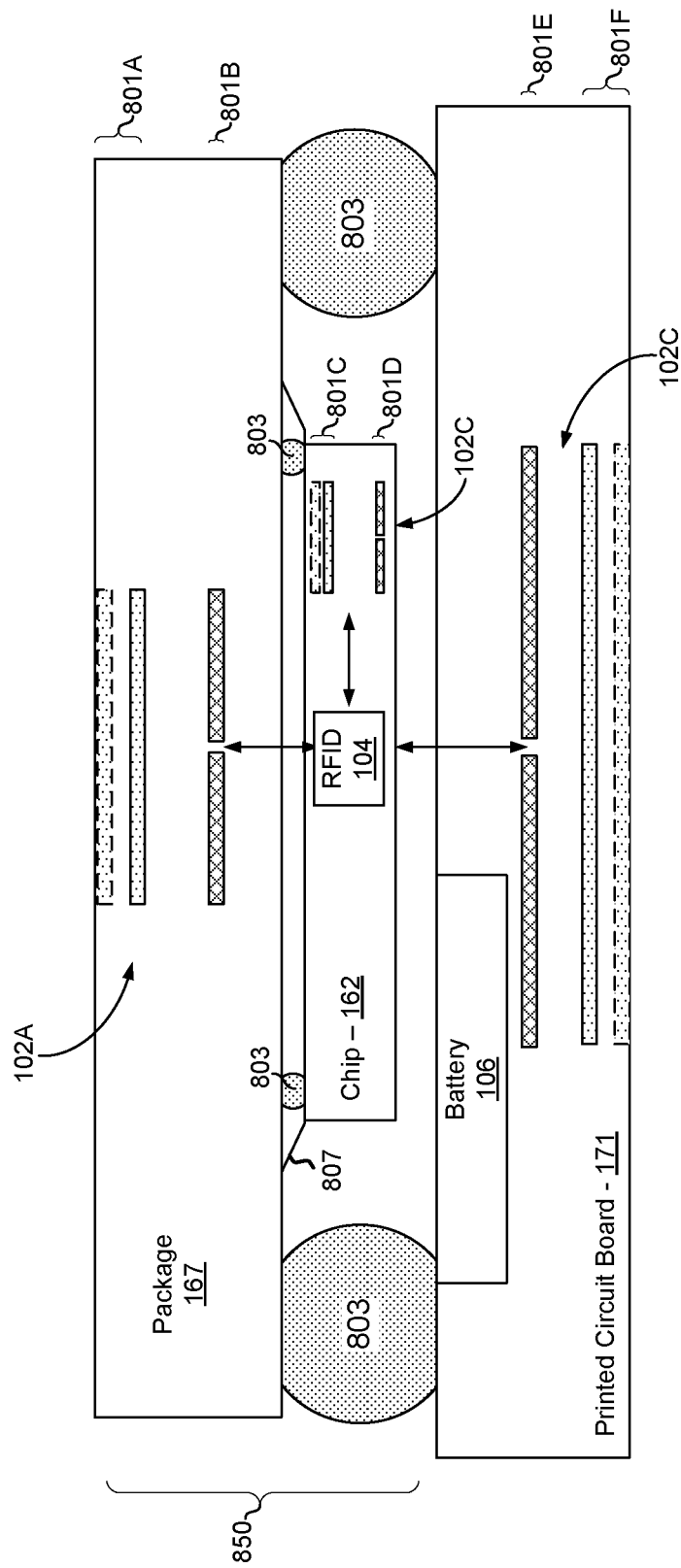
FIG. 8 is a diagram illustrating a cross-sectional view of a packaged integrated circuit with integrated leaky wave antennas, in accordance with an embodiment of the invention.

FIG. 8 is a diagram illustrating a cross-sectional view of a packaged integrated circuit with integrated leaky wave antennas, in accordance with an embodiment of the invention. Referring to FIG. 8A, there is shown a packaged integrated circuit 850 mounted on a PCB 171. The packaged integrated circuit 850 comprises metal layers 801A-801D, solder balls 803, an insulating layer 805, thermal epoxy 807, and leaky wave antennas 102A and 102B. Also shown are metal layers 801E and 801F, leaky wave antenna 102C and battery 106 on and/or within the PCB 171.

The integrated circuit ("chip") 162 may comprise circuitry manufactured on a substrate which may be a semiconductor material. In an exemplary embodiment of the invention, the IC 162 may be a more complex IC than the IC 104 described above. For example, the IC 162 may comprise a multi-functional system-on-chip as may be found in a wireless device such as a mobile phone. Accordingly, the IC 104 may comprise only a portion of the IC 162.

The package 167 may comprise, for example, a ceramic package. The package 167 may comprise insulating and conductive material, for example, and may provide isolation between electrical components mounted on the package 167. The chip 162 may, for example, be bump-bonded or flip-chip bonded to the package 167 utilizing the solder balls 803. In this manner, wire bonds connecting the chip 162 to the package 167 may be eliminated, thereby reducing and/or eliminating uncontrollable stray inductances due to wire bonds, for example. In addition, the thermal conductance out of the chip 162 may be greatly improved utilizing the solder balls 803 and the thermal epoxy 807. The thermal epoxy 807 may be electrically insulating but thermally conductive to allow for thermal energy to be conducted out of the chip 162 to the much larger thermal mass of the package 167. The metal layers 801A-801F may comprise deposited metal layers utilized to delineate leaky wave antennas in and/or on the chip 162, the package 167, and the printed circuit board 171.

In an embodiment of the invention, the spacing between pairs of metal layers, for example 801A and 801B, 801C and 801D, and 801E and 801F, may define vertical resonant cavities of leaky wave antennas. In this regard, a partially reflective surface, as shown in FIGS. 2A, 2B and 3, for example, may enable the resonant electromagnetic mode in the cavity to leak out from that surface. In this manner, leaky wave antennas may be operable to communicate wireless signals to and/or from the chip 162 to the package 167 and/or the printed circuit board 171, and/or to external devices.

The metal layers 801A-801F may comprise microstrip structures as described with respect to FIG. 7. The region between the metal layers 801A-801F may comprise a resistive material that may provide electrical isolation between the metal layers 801A-801F thereby creating a resonant cavity.

The number of metal layers is not limited to the number of metal layers 801A-801F shown in FIG. 8. Accordingly, there may be any number of layers embedded within and/or on the chip 162, the package 167, and/or the printed circuit board 171, depending on the number of leaky wave antennas, traces, waveguides and other devices fabricated.

The solder balls 803 may comprise spherical balls of metal to provide electrical, thermal and physical contact between the chip 162, the package 167, and/or the printed circuit board 171. In making the contact with the solder balls 803, the chip 162 and/or the package 167 may be pressed with enough force to squash the metal spheres somewhat, and may be performed at an elevated temperature to provide suitable electrical resistance and physical bond strength. The thermal epoxy 807 may fill the volume between the solder balls 803 and may provide a high thermal conductance path for heat transfer out of the chip 162.

In operation, the chip 162 may utilize one or more of the leaky wave antennas 102A, 102B, and 102C for communications other than RFID communications, such as cellular communications, and may additionally utilize one or more of the leaky wave antennas 102A, 102B, and 102C for RFID communications. That is, one or more of the leaky wave antennas 102A, 102B, and 102C may be shared among multiple wireless protocols.

Figure 9:
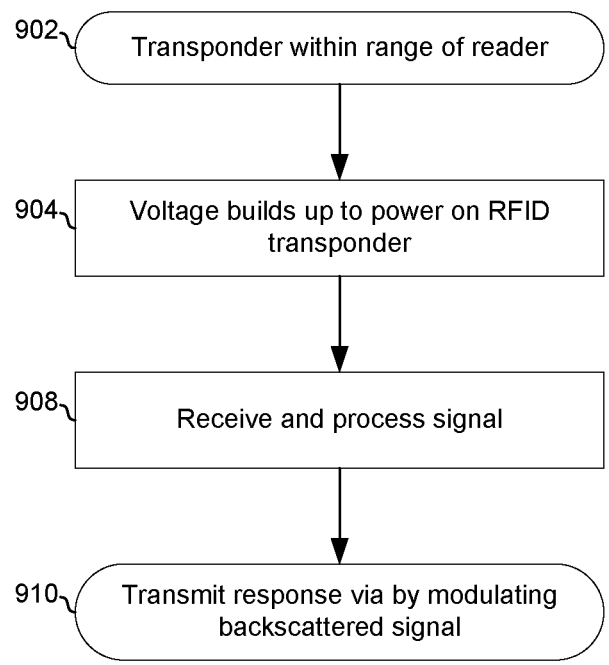
FIG. 9 is a block diagram illustrating exemplary steps for RFID communication via a leaky wave antenna, in accordance with an embodiment of the invention.

FIG. 9 is a block diagram illustrating exemplary steps for RFID communication via a leaky wave antenna, in accordance with an embodiment of the invention. Referring to FIG. 9, the exemplary steps may begin when the transponder 100 is within range of the reader 101. In step 904, for an active RFID transponder, the received signal may charge a capacitance in the signal detector 126 until a sufficient voltage has accumulated to close the switch 132 and power on the RFID transponder 100. For a passive transponder, the received signal may charge a capacitance in the power harvester 134 until sufficient energy is stored to power up the RFID transponder. In step 908 the radio may receive and demodulate the signal from the reader 101 and output the baseband signal to the processing subsystem 130. In step 910, upon receiving a particular sequence of bits, the processing subsystem 130 may begin outputting a response sequence of bits to the radio subsystem 128. The radio subsystem 128 may encode the bitstream from the processing subsystem 130 and modulate the backscattered signal. The backscattered signal may be modulated by switching a load into and out of the receive path, switching between a plurality of feed points of the leaky wave antenna 102, switching between a plurality of cavity heights, or a combination thereof.

Various aspects of a method and system for a RFID transponder with configurable feed point for RFID communications are provided. In an exemplary embodiment of the invention, an RFID transponder 100 may receive RF signals via a leaky wave antenna 102 and modulate an amplitude of a backscattered signal associated with the received RF signals by switching between a plurality of feed points 601A, 601B, and 601C of the leaky wave antenna 100 to vary an input impedance of the RFID transponder 100. Each of the plurality of feed points 601A, 601B, and 601C may be located in a different position in the resonant cavity of the leaky wave antenna 100. The input impedance may be controlled by switching a load 122 in and out of a receive path of the RFID transponder 100. The switching between the plurality of feed points 601 and/or the switching of the load 122 in and out of a receive path may be performed utilizing a micro-electromechanical system and/or one or more switches. The leaky wave antenna 102 may be integrated within and/or on an integrated circuit 850. The received RF signal may cause a charge to accumulate on one or more capacitors 152 in the RFID transponder 100 resulting in a voltage that may be utilized to control and/or power one or more portions of the RFID transponder 100. The voltage may be utilized to control a switch 132 that connects and disconnects a battery of the RFID transponder 100 to one or more other components of the RFID transponder. The voltage may be utilized to power a radio subsystem 128 and/or a processing subsystem 130 of the RFID transponder 100.

Other embodiments of the invention may provide a non-transitory computer readable medium and/or storage medium, and/or a non-transitory machine readable medium and/or storage medium, having stored thereon, a machine code and/or a computer program having at least one code section executable by a machine and/or a computer, thereby causing the machine and/or computer to perform the steps as described herein for a RFID transponder with configurable feed point for RFID communications.

Accordingly, aspects of the invention may be realized in hardware, software, firmware or a combination thereof. The invention may be realized in a centralized fashion in at least one computer system or in a distributed fashion where different elements are spread across several interconnected computer systems. Any kind of computer system or other apparatus adapted for carrying out the methods described herein is suited. A typical combination of hardware, software and firmware may be a general-purpose computer system with a computer program that, when being loaded and executed, controls the computer system such that it carries out the methods described herein.

One embodiment of the present invention may be implemented as a board level product, as a single chip, application specific integrated circuit (ASIC), or with varying levels integrated on a single chip with other portions of the system as separate components. The degree of integration of the system will primarily be determined by speed and cost considerations. Because of the sophisticated nature of modern processors, it is possible to utilize a commercially available processor, which may be implemented external to an ASIC implementation of the present system. Alternatively, if the processor is available as an ASIC core or logic block, then the commercially available processor may be implemented as part of an ASIC device with various functions implemented as firmware.

The present invention may also be embedded in a computer program product, which comprises all the features enabling the implementation of the methods described herein, and which when loaded in a computer system is able to carry out these methods. Computer program in the present context may mean, for example, any expression, in any language, code or notation, of a set of instructions intended to cause a system having an information processing capability to perform a particular function either directly or after either or both of the following: a) conversion to another language, code or notation; b) reproduction in a different material form. However, other meanings of computer program within the understanding of those skilled in the art are also contemplated by the present invention.

While the invention has been described with reference to certain embodiments, it will be understood by those skilled in the art that various changes may be made and equivalents may be substituted without departing from the scope of the present invention. In addition, many modifications may be made to adapt a particular situation or material to the teachings of the present invention without departing from its scope. Therefore, it is intended that the present invention not be limited to the particular embodiments disclosed, but that the present invention will include all embodiments falling within the scope of the appended claims.

What is claimed is:

1. A leaky wave antenna, comprising:
   a reflective surface configured to reflect electromagnetic energy corresponding to a signal;
   a partially reflective surface configured to reflect less than all of the electromagnetic energy corresponding to the signal, the partially reflective surface being spaced apart from the reflective surface to form a cavity therebetween;
   a plurality of feed points configured to inject signals into the cavity, the signal being injected into the cavity by one of the plurality of feed points based upon an input impedance of the leaky wave antenna,
   wherein the input impedance of the leaky wave antenna is set by a position of the one of the plurality feed points that injects the signal relative to the reflective surface, and
   the partially reflective surface includes a plurality of slots to allow a portion of the electromagnetic energy to radiate from the leaky wave antenna, a spacing between the plurality of slots being adjustable via micro-electromechanical systems (MEMS) to set a Q factor for the leaky wave antenna.

2. The leaky wave antenna of claim 1, wherein each of the plurality of feed points is disposed at a different location relative to the reflective surface to provide different input impedances for the leaky wave antenna.

3. The leaky wave antenna of claim 1, further comprising a micro-electromechanical system (MEMS) configured to vary a distance between the reflective surface and the partially reflective surface.

4. The leaky wave antenna according to claim 3, wherein the MEMS moves at least one of the reflective surface and the partially reflective surface.

5. The leaky wave antenna according to claim 4, wherein the MEMS varies the distance between the reflective surface and the partially reflective surface based on a bias voltage provided to the MEMS to set a resonant frequency of the leaky wave antenna.

6. The leaky wave antenna according to claim 5, wherein the MEMS causes at least one of the reflective surface and the partially reflective surface to move through deflection.

7. The leaky wave antenna according to claim 1, wherein the partially reflective surface is a metal surface in which the plurality of slots are formed.

8. The leaky wave antenna according to claim 7, wherein a bandwidth of the leaky wave antenna is determined by a spacing, dimension, shape and orientation of the plurality of slots.

9. The leaky wave antenna according to claim 8, wherein the spacing between the slots corresponds to a signal to be transmitted or received.

10. The leaky wave antenna according to claim 1, wherein the reflective surface and the partially reflective surface are coplanar microstip waveguides.

11. The leaky wave antenna according to claim 1, wherein the cavity is filled with a dielectric.

* * * * *